United States Patent [19]

Gonzales

[11] 4,334,261
[45] Jun. 8, 1982

[54] UNIVERSAL INPUT/OUTPUT SYSTEM CONSTRUCTION FOR PROGRAMMABLE CONTROLLERS

[75] Inventor: Roman Y. Gonzales, Andover, Mass.

[73] Assignee: Gould Inc., Rolling Meadows, Ill.

[21] Appl. No.: 189,948

[22] Filed: Sep. 22, 1980

[51] Int. Cl.³ .............................................. H05K 7/16
[52] U.S. Cl. .................................. 361/426; 361/415; 339/64 R
[58] Field of Search ............................. 179/91 R, 98; 339/17 LM, 17 M, 17 N, 64; 361/331, 338, 339, 340, 380, 390–395, 399, 415, 426, 334

[56] References Cited

U.S. PATENT DOCUMENTS

| | | | |
|---|---|---|---|
| 3,689,128 | 9/1972 | Andreini | 361/338 |
| 3,784,728 | 1/1974 | De Bortoli | 361/426 |
| 3,942,077 | 3/1976 | Powers | 361/331 |
| 4,002,955 | 1/1977 | Eggert | 361/391 |
| 4,215,386 | 7/1980 | Prager | 361/394 |
| 4,247,882 | 1/1981 | Prager | 361/426 |

*Primary Examiner*—Gerald P. Tolin
*Attorney, Agent, or Firm*—Mattern, Ware, Stoltz & Fressola

[57] ABSTRACT

By providing an input/output housing which incorporates paired slider assemblies for supportingly maintaining a printed circuit board in secure electronic engagement between a central processor and external devices, with said printed circuit board being quickly and easily removable from the electronically engaged position, an input/output system for a programmable controller is achieved which is capable of being quickly and easily expanded as well as capable of rapid field assembly and field disassembly for removal or replacement of any required parts. In addition, the external equipment wiring is made to a terminal block which is mounted between the paired slider assemblies and pivotally engaged therein to provide readily accessible contact points for initial interconnection thereto, while also being pivotally movable and slidingly advanceable into the housing for continuous maintenance therein in a secure, hidden, easily accessible storage zone. In the preferred embodiment, all connectors in the input/output system are solderless connections to assure rapid assembly and disassembly capabilities.

15 Claims, 26 Drawing Figures

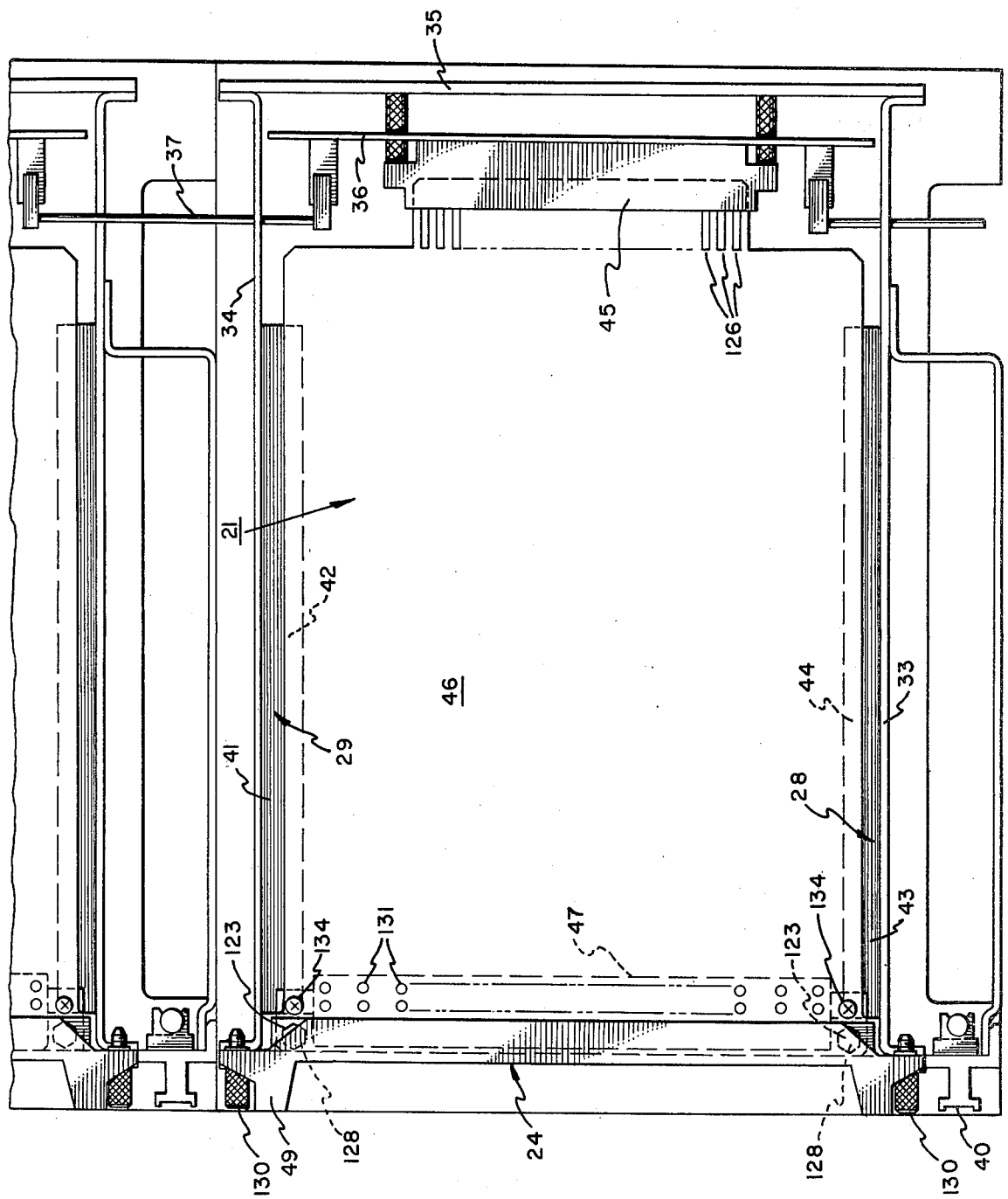

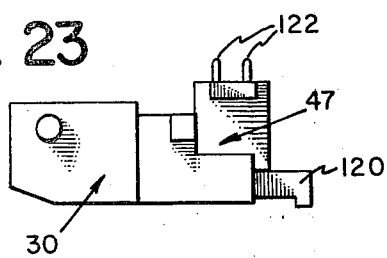
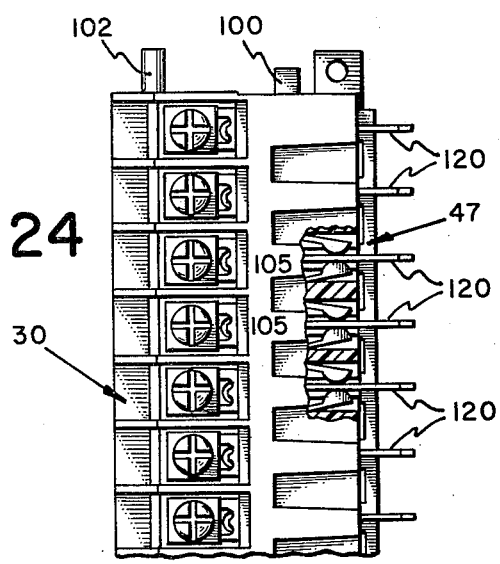
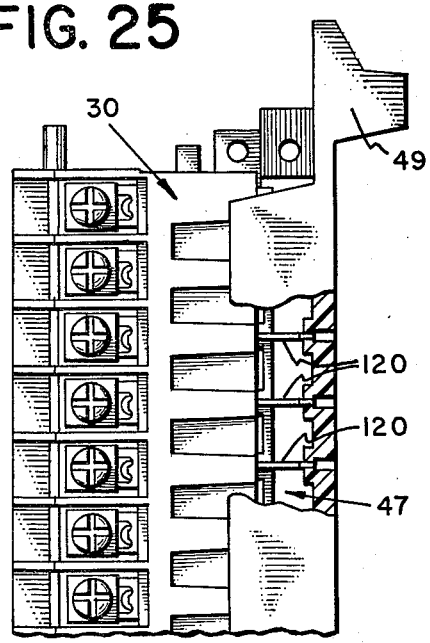
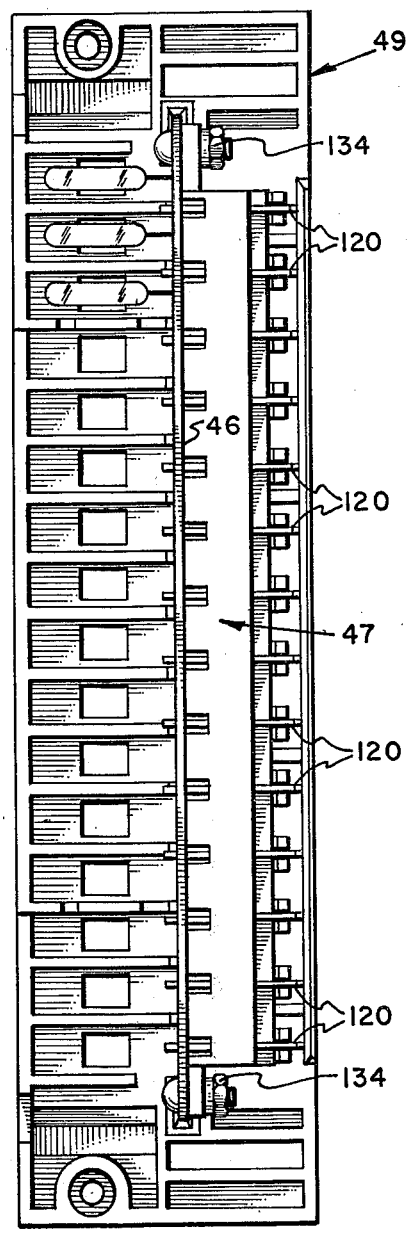

UNIVERSAL INPUT/OUTPUT SYSTEM CONSTRUCTION FOR PROGRAMMABLE CONTROLLERS

RELATED APPLICATION

This application is a related application of my presently pending U.S. patent application bearing Ser. No. 030,849, filed Apr. 17, 1979.

TECHNICAL FIELD

This invention relates to programmable controllers, and more specifically to expandable, multi purpose input/output systems and slider assemblies incorporated therein.

BACKGROUND ART

Typically, programmable controllers have been constructed with input/output systems being interconnected with the programmable controller in a manner which would require the external devices being controlled thereby to be disconnected whenever a particular input/output panel is removed, replaced, or rearranged. Consequently, costly, time consuming effort is generally required in these prior art systems to disconnect the input/output terminals from the various external equipment and, afterwards, effectuate the reconnection of the equipment in the desired manner.

In addition, the prior art system must be shut down in order to make the desired or required changes to an individual input/output circuit. Since shutdowns result in expensive down time, additional costs are incurred in replacing and removing input/output circuits from these prior art systems.

More recently, advances have been made in modular input/output panel constructions for programmable controllers. These more recent prior art systems have resolved some of these prior art difficulties by achieving an input/output assembly which does not require complete shutdown of the programmable controller and allows the external equipment wiring to remain in their original connections while the input/output module is removed, replaced or repaired. These systems represent the best prior art patents of which we are aware and are exemplified in U.S. Pat. No. 3,942,077 of Howard A. Powers.

In Powers, input/output modules are taught which are capable of being directly plugged into an input/output panel housing which incorporate fixed terminals to which the external equipment is connected. In this way, the previous necessity for disconnecting the external equipment wiring during removal or replacement of the input/output modules is eliminated.

In addition to Powers, Jay M. Prager and Joseph F. Sadlow have a patent application pending in the U.S. Patent and Trademark Office relating to a Modular Panel Construction for Programmable Controller bearing Ser. No. 883,277 and filed Mar. 3, 1978 now U.S. Pat. No. 4,215,386. This patent application, the references cited therein, and Powers represents the best prior art of which I am aware.

Although the Prager and Sadlow patent application discloses a system which overcomes some of the drawbacks experienced with the input/output module system of Powers, both Powers and Prager and Sadlow require the use of modules, wherein each module serves as an independent housing for a particular printed circuit board. Prager and Sadlow have achieved a system which has made substantial advances over the input/output module disclosed in Powers, however, the input/output module disclosed in their patent application has been unable to meet the demands and constraints imposed upon systems wherein only the printed circuit board is mounted, without a separate modularized housing supportingly containing the printed circuit board.

In particular, these prior art plug-in input/output modules are not able to meet the different requirements for being both panel mounted or rack mounted, without required specially design adaptors. Also, the prior art modules have been found to require a greater area per input/output than various users have available as well as being generally unable to meet all of the various standards and requirements imposed upon a single system throughout the world.

Therefore, it is the principal object of this invention to provide an input/output system, for interconnection with a central processor to form a programmable machine controller, which supportingly maintains a plurality of input/output printed circuit boards in readily accessible positions for quick and easy insertion, removal and replacement of the printed circuit board without necessitating removal of the external devices electronically engaged thereto.

Another object of this invention is to provide an input/output system having the characteristic features defined above wherein the printed circuit board can be simply positioned in a holder and rapidly and easily moved into secure and complete electronic engagement with both the external devices and the central processor.

Another object of this invention is to provide an input/output system having the characteristic features defined above which is capable of rapid assembly and disassembly without requiring soldering, thereby assuring easy and reliable field maintenance while also being reliable and reasonably priced.

A further object of the present invention is to provide an input/output system having the characteristic features defined above which is quickly and easily expanded by simply assembling and interconnecting additional units up to the maximum capabilities of the central processor.

Another object of this invention is to provide an input/output system having the characteristic features defined above which is capable of meeting all worldwide standards as well as being capable of being either rack mounted or panel mounted.

Another object of this invention is to provide an input/output system having the characteristic features defined above as well as having a high input/output density, thereby providing a maximum number of input/output points per square area as is feasible.

Other and more specific objects will in part be obvious and will in part appear hereinafter.

DISCLOSURE OF THE INVENTION

The input/output system of the present invention eliminates the prior art problem and achieves a multipurpose, universally applicable, rapidly expandable construction by providing an input/output system which is capable of (1) being constructed for either panel mounting or rack mounting using the same components, (2) having the external equipment wiring terminal block positioned conveniently for assembly ease as well as being positioned in a secure but accessible storage location after assembly, (3) receiving a plurality of input/output printed circuit boards as a quick and easy plug-in board wherein all interconnections are simultaneously made when inserted and broken when disconnected, and (4) being quickly and easily assembled and interconnected to the controller or cooperating systems.

One of the unique and important components of the input/output system of this invention are the slider assemblies mounted to the input/output housing in cooperating pairs for supportingly receiving and positioning the input/output printed circuit boards for controlled electronic engagement between the central processor and the external equipment. In addition, the slider assemblies support the terminal block for interconnection of the external equipment wiring to the printed circuit board as well as providing the terminal block with the ability to be moved between alternative positions for assembly and storage, as well as quickly and easily removed or inserted, when desired.

By providing an input/output system which can be assembled for either panel mounting or rack mounting, the input/output system of the present invention is capable of satisfying all of the varying requirements for system constructions and arrangements in the different countries throughout the world. In particular, most European countries employ rack mounted constructions, while panel mounting is preferred in the United States and Japan. Prior art systems are not capable of satisfying both requirements and, as a result, require either separate units or special adaptors to be manufactured in order to satisfy these varying standards. With the input/output system of the present invention, either a rack mounting system or panel mounting system is easily and rapidly achieved by merely positioning two support panels in one of their two alternative locations.

In the preferred embodiment of this invention, each input/output printed circuit board incorporates front connectors and rear edge connectors, in order to easily simultaneously electronically interconnect the printed circuit board to the external equipment and the central processor. By simply positioning the printed circuit board in the slider assembly and inserting the printed circuit board into the housing, the rear connectors of the printed circuit board are quickly and easily electronically engaged with rear connectors mounted in the back plane of the input/output housing while the forward connectors of the printed circuit board are electronically engaged with the external devices through a front cover-connector mountable to the input/output system.

The front cover-connector may be constructed in many alternative ways to electronically interconnect the front connectors of the printed circuit board with the contact points of the external devices, all of which depend upon the type of front connector employed on the printed circuit board. Any one of these various alternatives may be employed as long as rapid assembly is assured and secure electronic engagement is provided, with removal or replacement of printed circuit boards being capable without disconnecting any external equipment wiring.

The versatility, field maintainability and rapid expandability of the input/output system of this invention is further enhanced by providing rapidly interconnectable input/output systems which also incorporate address selection means for ease of use. Furthermore, the entire input/output system is easily dis-assembled and assembled either in its entirety or by merely removing a single printed circuit board, without requiring any soldering or any repeated hand wiring.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings, in which:

FIG. 22 is a cross sectional side elevation view of two input/output systems and this invention in electronic interengagement;

FIG. 23 is a top plan view of the front connector shown in electronic engagement with the terminal block of the input/output system of this invention;

FIG. 24 is a side elevation view, partially broken away, of the front connector in electronic engagement with the terminal block of the input/output system of this invention;

FIG. 25 is a side elevation view, similar to FIG. 24, showing the front cover mounted with the front connector; and FIG. 26 is a rear elevation view of a printed circuit board mounted to the front connector and cover ready for insertion into the input/output system of this invention.

BEST MODE FOR CARRYING OUT THE INVENTION

Figure 1:
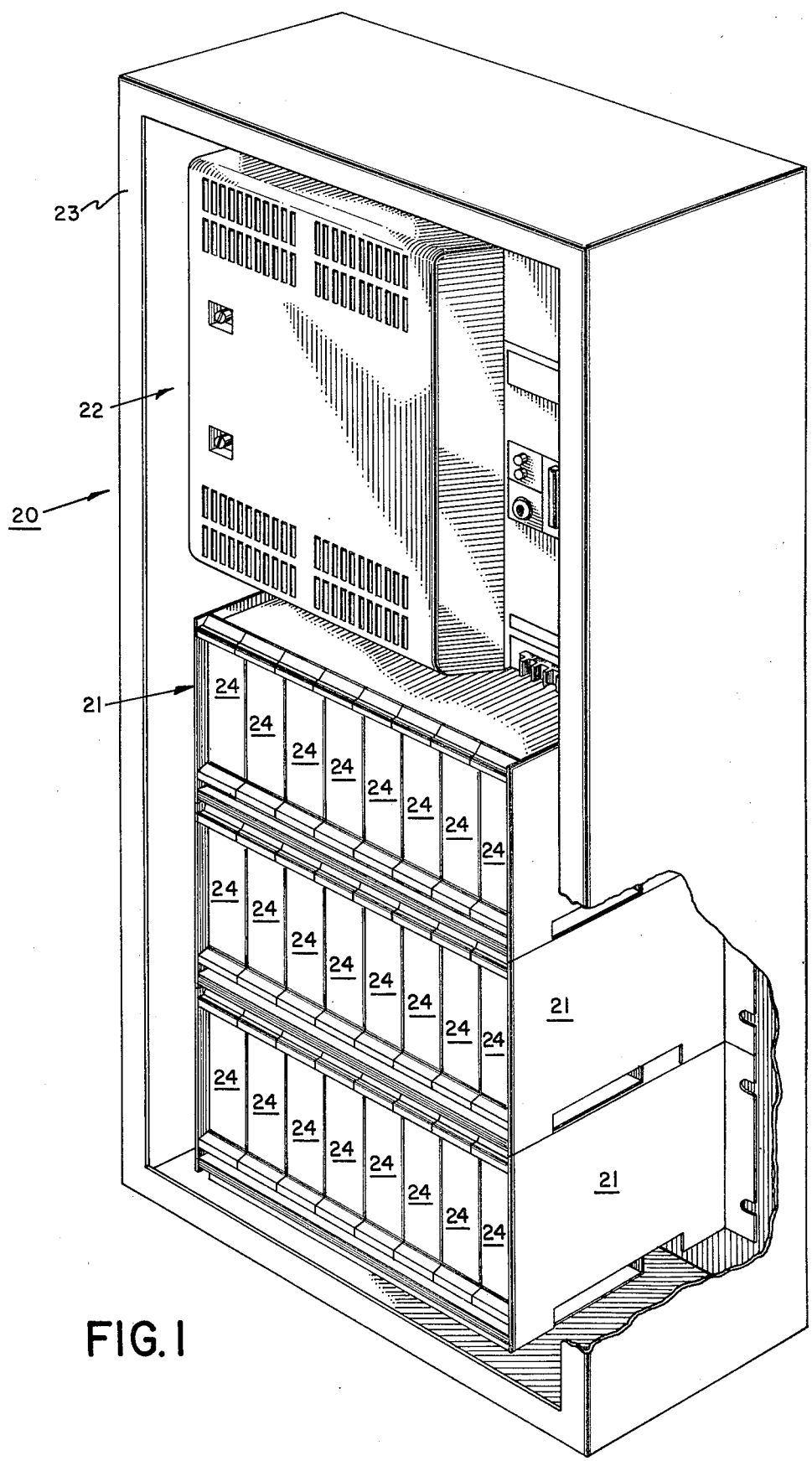
FIG. 1 is a perspective view of a programmable controller incorporating the input/output system of this invention.

In FIG. 1, a programmable controller 20 is shown incorporating 3 input/output systems 21 of this invention and a combination central processor, memory, and power supply forming mainframe 22. In this particular embodiment, programmable controller 20 is shown mounted in a cabinet 23 with input/output systems 21 mounted to the rear panel of cabinet 23. As is well known in the art, programmable controller 20 is constructed to receive information from various external equipment, process this information and, in accordance with a particular preset instruction program, provide input information in order to control the particular external equipment connected thereto.

Mainframe 22 incorporates the user control program, receives the input information from the input circuit boards, which are incorporated within input/output system 21, process the information received, and delivers output instructions to output circuit boards also incorporated in input/output system 21. The power supply portion of mainframe 22 drives the central processor and the various circuits of the input/output system 21.

As shown in FIG. 1, each input/output system 21 preferably incorporates eight independent input/output modules 24. In this embodiment, each input/output module 24 accommodates eight input/output points. Although input/output system 21 may be employed with less than eight input/output modules 24, the maximum capacity for each input/output assembly is 64 input/output points.

Since the embodiment shown in FIG. 1 contains three input/output systems, a total of 192 input/output points are available to the user. Depending upon the user's requirements, fewer input/output systems 21 may be employed or additional input/output systems 21 can be quickly and easily incorporated into controller 20 in order to expand the available input/output points. Regardless of the particular number of input/output points required, each input/output module 24, with its eight input/output points, has achieved an increased packing density over prior art systems, providing increased controller capability for the size of the controller. As is well known in the art, each input/output module 24 provides either input information or output instructions depending upon the type of printed circuit board employed and the equipment connected thereto.

Input/Output Systems

Figure 2:
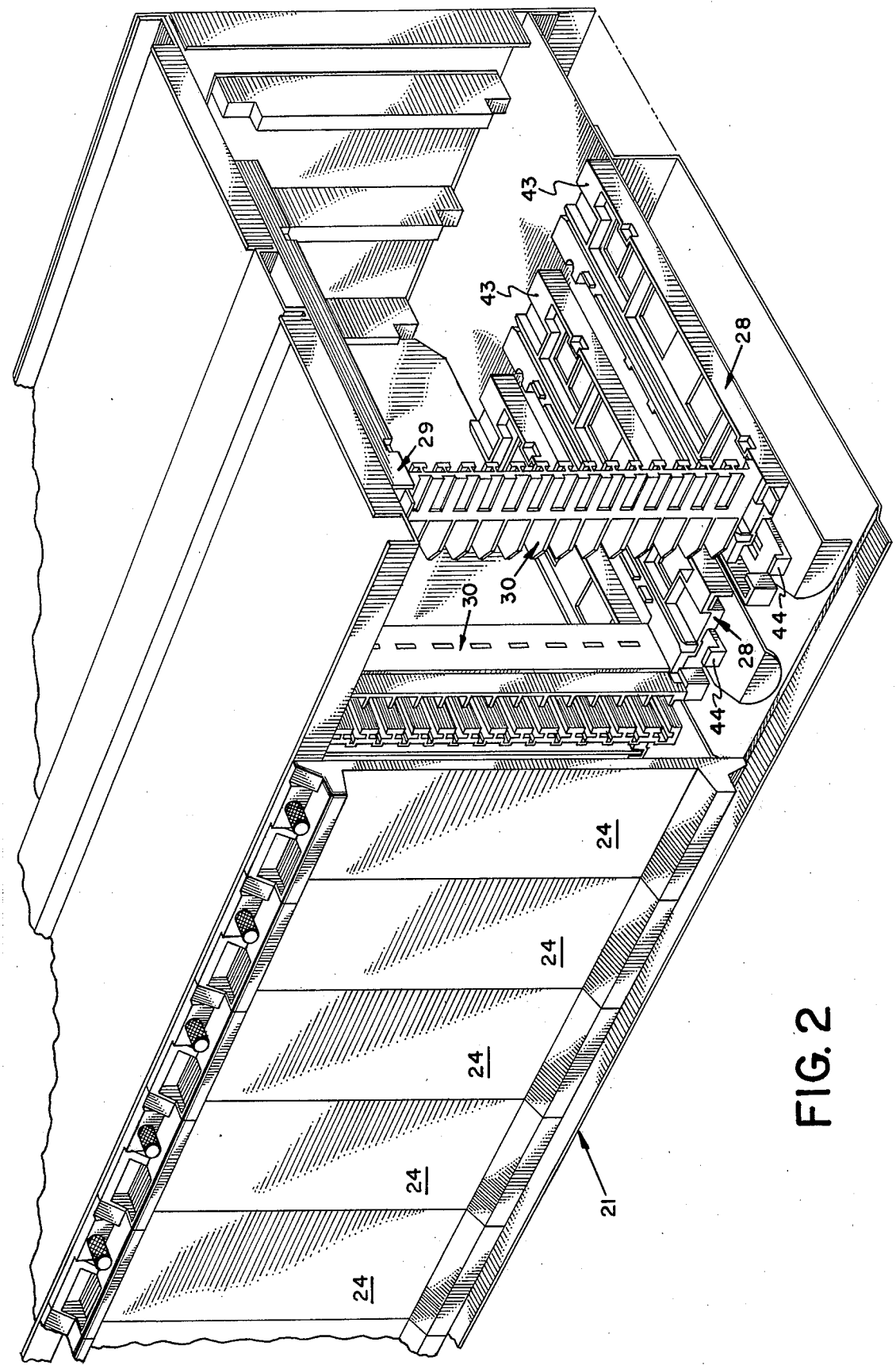
FIG. 2 is a perspective view of an assembled input/output system with two slider assemblies shown in two of their alternate positions with the printed circuit board removed therefrom.

In FIG. 2, one input/output system 21 is shown with five input/output modules 24 fully assembled and two modules 24 partially assembled. In order to reduce the physical size of prior art programmable controllers, wherein each input/output circuit was contained in an individual modularized housing, the present invention has completely eliminated modularized housings and has provided a system wherein the input/output printed circuit board is securely mounted in the input/output assembly while still having all of the advantages previously only obtainable with the prior art modularized housing systems.

As briefly discussed above, these modularized housing systems achieved a high degree of flexibility by providing quick removability and replaceability of each input/output module without requiring rewiring or shutdown of the system. This not only provided for quick system repair, but also achieved greater flexibility for rearrangement of input/output modules whenever required. Until the present invention, however, these advantageous characteristics were only obtainable with modularized housings and were not available in systems where input/output printed circuit boards were employed independently, without self-contained modularized housings.

One of the ways in which input/output system 21 achieves this previously unobtainable goal is by incorporating a lower slider assembly 28 paired with an upper slider assembly 29 as integral parts of each input/output module 24. Associated with paired slider assemblies 28 and 29 is a terminal block 30, which is pivotably mounted between upper and lower slider assemblies 28 and 29. Terminal block 30 also has limited vertical movement within slider assemblies 28 and 29 in order to assure that secure, interconnected engagement of terminal block 30 with the front cover connector will be easily effectuated.

As shown in FIG. 2, terminal block 30 pivots between slider assemblies 28 and 29 when the slider assemblies are moved from a terminal block locking position to a terminal block pivot position. These two positions are clearly shown in FIG. 2. When terminal block 30 is in its open, pivoted position, the user is provided with an easy access for mounting the external equipment wiring thereto.

As will be more fully described below, each slider assembly 28 and 29 incorporates a printed circuit board receiving recess for positioning and securely maintaining the input/output printed circuit board in electronic engagement with the central processor. However, when an input/output circuit board must be removed or replaced, the board can be quickly and easily removed from slider assemblies 28 and 29. In addition, if desired, the printed circuit board can be disconnected and inspected while still mounted between slider assemblies 28 and 29. The initial movement of the printed circuit board assures disconnection of all electronic engagement of the particular printed circuit board with the system, thereby preventing any electronic hazards from occurring.

Figure 3:
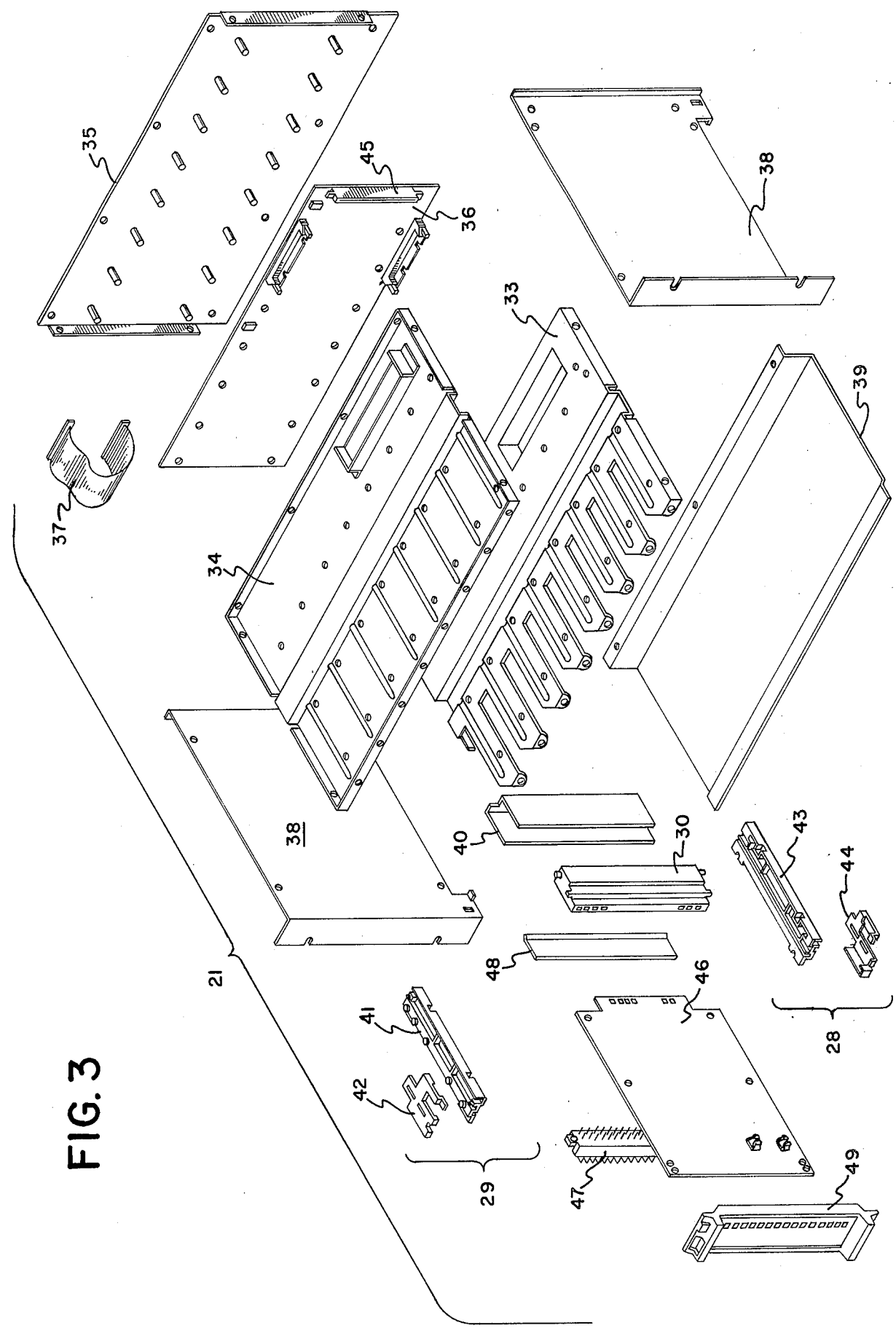
FIG. 3 is an exploded perspective view of the input/output system of this invention.

By referring to FIG. 3, the components which form input/output system 21 can best be understood, as well as its actual construction and interconnected arrangement. The basic housing for input/output system 21 comprises a lower support plate 33, an upper support plate 34, a back plate 35, a back plane connection system 36, cable connector 37, two side plates 38, and a wire support plate 39. With these seven items, the entire input/output system is created, preferably employing easily formed sheet metal stampings or easily molded manufactured components. Preferably, cable connector 37 comprises a 50 conductor ribbon cable.

The entire input/output system 21 is completed by mounting the components which form each of the seven input/output modules 24. For purposes of simplicity, FIG. 3 shows the components required for a single input/output module, although it would be obvious to one skilled in the art that seven additional sets of components would be mounted to each of the other seven positions available for the input/output modules.

As shown in FIG. 3, each input/output module 24 incorporates an upper slider assembly 29 comprising track guide member 41 which is securely mounted to upper plate 34 and a cooperating movable slider member 42 which is slidably engaged with track guide member 41. Similarly, lower slider assembly 28 comprises a lower track guide member 43 which is securely mounted to lower support plate 33 and incorporates cooperating movable slider member 44 slidably engaged therewith.

Terminal block 30 is pivotally and adjustably mounted to slider assemblies 28 and 29 for arcuate pivotable movement therebetween when sliders 42 and 44 are in their terminal block pivot position. User wiring holding duct 40 engages between adjacent slider assemblies and maintains the user wiring in position, while cover 48 engages terminal block 30 to provide close of the wire connection points of the terminal block from accidental contact. Rear edge connector 45 is mounted to back plane 36 for mating receipt of the printed circuit board when engaged in its operational position.

Input/output module 24 is then completed by positioning input/output printed circuit board 46 and connector 47 in their electronically engaged positions and mounted to front cover 49. Then, printed circuit board 46 is engaged between slider assemblies 28 and 29 with connector 47 electronically engaging terminal block 30 with printed circuit board 46.

In addition to providing a high density, compact, multi-purpose, expandable input/output system which is capable of quick and easy disengagement of each input/output circuit and replacement or rearrangement thereof, the present invention also achieves a unique input/output system construction which can be employed for either panel mounting or rack mounting. It has been found that manufacturers in both the United States and Japan prefer to mount controller systems in either self-contained cabinets or directly to panels wherein these assemblies are mounted along the rear plane thereof. This arrangement is shown in FIGS. 1 and 2.

However, most European manufacturers prefer to have controller systems mounted in a rack arrangement wherein each individual component is mounted along a forward edge thereof. Input/output system 21 of the present invention achieves maximum flexibility with a minimization of parts by providing side mounting panels 38 which are reversible, depending upon the particular preferred mounting arrangement. When the flanged holding portion of side panels 38 are positioned at the rear, as shown in FIGS. 1 and 2, the input/output assembly is ready for panel mounting. However, when side panels 38 are positioned with the bracket portion thereof mounted along the forward edge, as shown in FIG. 3, the resulting input/output assembly 21 is ready for rack mounting. In this way, input/output assembly 21 is readily adaptable to any environment or arrangement desired with simplicity and ease in order to assure maximum field maintainability as well as field assembly.

Slider Assembly

In order to provide an input/output system 21 with the desired versatility and flexibility, each input/output module 24 must be readily accessible for installation of the user wiring as well as being able to accommodate an input/output printed circuit board quickly and easily for interconnection, disconnection, and removal from assembly 21. This heretofore unobtainable goal has been reached by input/output system 21 of the present invention by incorporating slider assemblies 28 and 29 in each input/output module. By referring to FIGS. 4 through 16, the construction and operation of the preferred embodiment for a slider assembly can best be understood.

Figure 4:
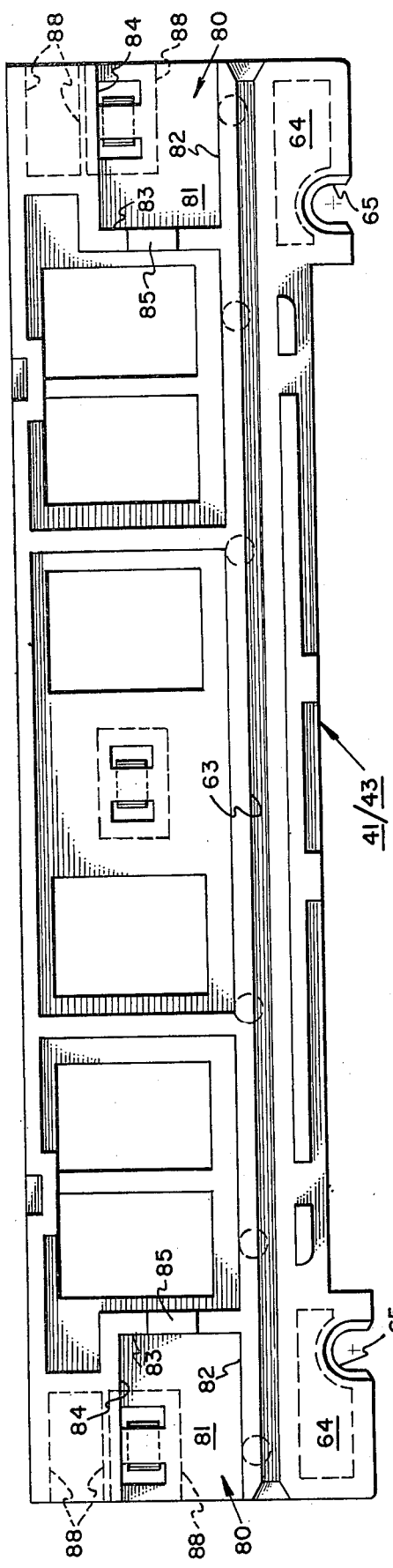
FIG. 4 is a top plan view of the track guide member which forms a part of the slider assembly.
Figure 5:
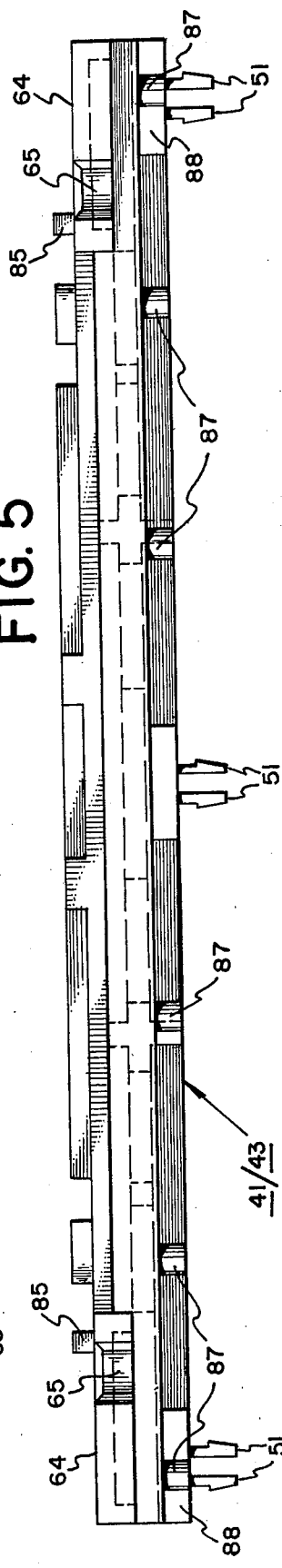
FIG. 5 is a side elevation view of the track guide member of FIG. 4.
Figure 6:
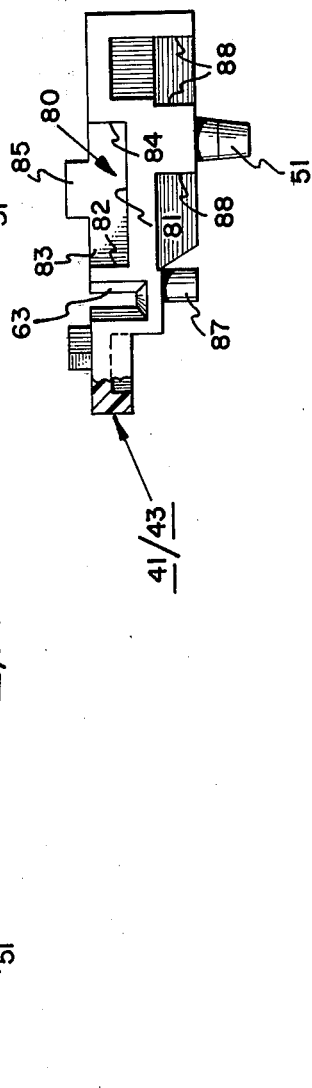
FIG. 6 is a front elevation view of the track guide member of FIG.4.

In FIGS. 4, 5, and 6, the preferred construction for the track guide members 41 and 43 are shown. In this preferred embodiment, track guide member 41 and track guide member 43 comprise the identical structure, constructed in a manner which allows the track guide member to be mounted to either the top or bottom support plate. In this way, both the manufacture and assembly of slider assemblies 28 and 29 are simplified.

In order to assure clarity throughout this detailed disclosure, the upper track guide is referred to throughout the disclosure as track guide member 41, and the lower track guide is referred throughout this disclosure as track guide member 43. However, during the detailed disclosure of the specific construction of the track guide member, wherein the discussion is applicable to both track guide member 41 and track guide member 43, since in their preferred embodiment they are identical, the track guide member will be referred to as track guide member 41/43.

As is readily apparent from FIGS. 4, 5, and 6, track guide member 41/43 is perfectly symmetrical about its central, transverse axis. In this way, with one half of track guide member 41/43 comprising the mirror image of the other half, track guide member 41/43 provides a single manufactured part which is capable of being employed as both lower track guide member 43 and upper track guide member 41.

In order to securely mount track guide member 41/43 to either upper support plate 34 or lower support plate 33, track guide member 41/43 comprises a plurality of flexible locking tabs 51, which are positioned along a longitudinal axis of track guide member 41/43. As best seen in FIG. 5, each locking tab 51 preferably comprises at least one sloping surface which cammingly engages a recess formed in the particular support plate and a locking and holding surface which engages with the support plate when track guide member 41/43 has been advanced into the accomodating recess of the support plate.

Preferably, locking tabs 51 are formed along track guide member 41/43 in pairs, in juxtaposed spaced facing relationship with each other, with the bevelled, camming surface positioned on the opposed side of the facing surface. In this way, a rectangular accomodating recess formed in each support plate is employed to simultaneously engage a pair of locking pins 51 therein. By employing locking tabs 51, track guide member 41/43 achieves a quick and easy snap-in construction, allowing the assembly and positioning of track guide member 41/43 in its desired position with simplicity and ease.

Track guide member 41/43 incorporates an elongated channel or track 63 formed into the top suface thereof and extending the entire length of track guide member 41/43. Channel 63 is incorporated into track guide member 41/43 to provide the requisite guide or track for properly positioning and securely holding and maintaining an input/output printed circuit board. In order to assure ease and convenience in inserting an input/output printed circuit board in channel 63 for guided insertion therein, channel 63 incorporates bevelled edges at both ends thereof to form a generally U-shaped opening. As is readily apparent from the preceding description, both ends of channel 63 should be bevelled in order to assure the complete symmetry and operating equivalency of both ends of track guide member 41/43.

Track guide member 41/43 also incorporates terminal block supporting platforms 64 formed at both ends thereof, adjacent elongated channel 63. In addition, each platform 64 incorporates a substantially U-shaped aperture 65 formed in platform 64. As is more fully described below, U-shaped apertures 65 cooperatingly engage and retain pivot pins formed on the terminal block, to provide secure holding and pivoting engagement of the terminal block with track guide member 41/43. In addition, as is more completely discussed below, aperture 65 comprises a U-shaped configuration to assure ease of installation and removal of the terminal block, whenever required.

As best seen in FIGS. 4 and 6, track guide member 41/43 incorporates two holding zones 80 formed at both ends thereof, adjacent elongated channel 63. Each holding zone 80 incorporates a floor 81 with floor 81 bounded on three sides by upstanding walls 82, 83, and 84. Rear wall 83 also incorporates an upstanding post 85.

Holding zone 80, with its front opening and three wall configuration, is positioned adjacent supporting platform 64 and U-shaped aperture 65 to provide easy pivoting entry and holding containment of a locking tab formed on terminal block 30. In addition, rear wall 83 and upstanding post 85 establish a secure, positive pivot stop for terminal block 30.

In the preferred embodiment, rear wall 83 is positioned substantially perpendicular to the longitudinal axis of platform 64 and spaced slightly rearwardly of U-shaped aperture 65. As a result, terminal block 30 is capable of pivoting about its pivot axis, as defined by aperture 65 through an arcuate distance of about 90 degrees. When in its fully pivoted position, the user wire connection terminals of terminal block 30 are forward facing, thereby providing ready accessibility for installation of equipment wires. This construction, in combination with rear wall 83 and post 85, assures that over pivoting is prevented and a secure holding surface is achieved to provide added convenience for the operator during the wire installation process.

In order to provide cooperating, controlled, limited sliding engagement with movable slider members 42 and 44, track guide member 41/43 incorporates guide means for interengagement therewith. Although the guide means incorporated on track guide member 41/43 may comprise a plurality of alternative configurations or forms, the preferred construction for the requisite guide means is best seen in FIGS. 5 and 6.

As shown therein, the guide means comprise a plurality of independent posts 87, each of said posts extending from the bottom surface of track guide member 41/43, substantially perpendicularly thereto. In addition, the plurality of posts 87 extend longitudinally along track guide member 41/43 in a substantially straight line. As is fully described below in reference to movable slider members 42 and 44, guide posts 87 cooperatingly engage with elongated slots formed in movable sliders 42 and 44 to provide the desired sliding interengagement of movable slider members 42 and 44 with track guide member 41/43.

Track guide member 41/43 also incorporates guide walls or rails 88 which cooperate with movable slider members 42 and 44 to assure secure, guided movement thereof. As is fully described below, slider members 42 and 44 move relative to track guide member 41/43 between three alternate positions. These three positions are referred to throughout the Specification as (1) a terminal block locked position, (2) a terminal block pivot position, and (3) a terminal block disengagement position. The construction of slider members 42 and 44 and its movable interengagement with track guide member 41/43 assures complete operator controlled, movement ease between any one of these three alternate positions. By referring to FIGS. 7-10, the preferred construction of slider members 42 and 44 can best be understood.

Figure 7:
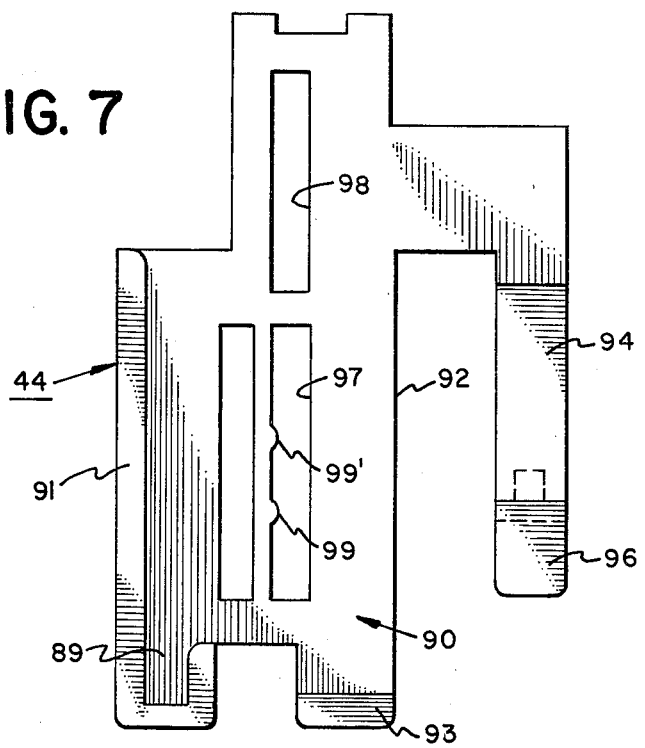
FIG. 7 is a top plan view of the lower slider member which forms a part of the lower slider assembly.
Figure 8:
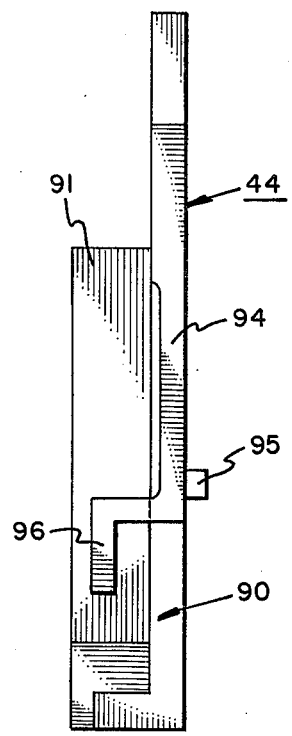
FIG. 8 is a side elevation view of the lower slider member of FIG. 7.
Figure 9:
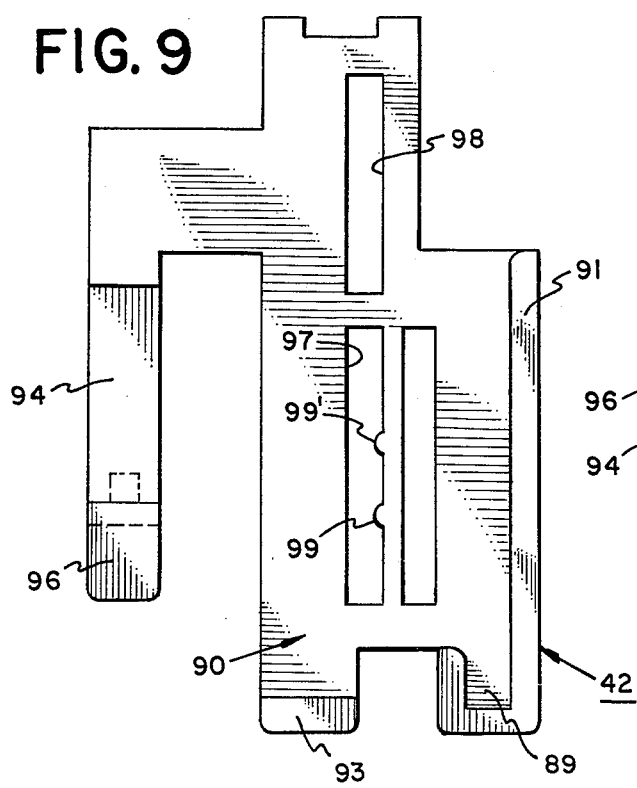
FIG. 9 is a bottom plan view of the upper slider member which forms a part of the upper slider assembly.
Figure 10:
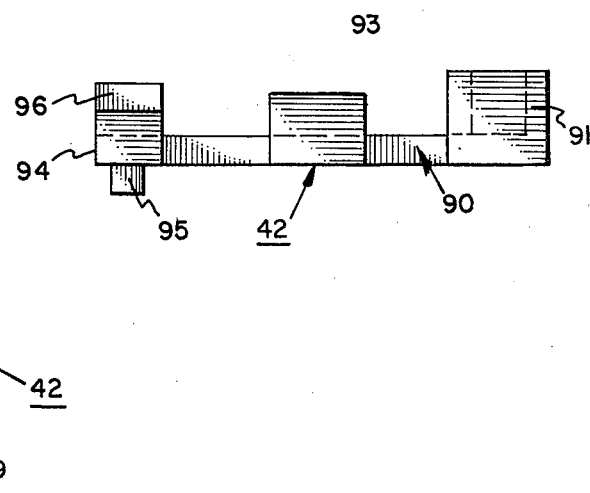
FIG. 10 is a front elevation view of the upper slider member of FIG. 9.

In FIGS. 7 and 8, bottom slider member 44 is shown, while in FIGS. 9 and 10, top slider member 42 is depicted. By comparing FIG. 7 with FIG. 9, it is readily apparent that top slider member 42 and bottom slider member 44 are virtually identical in construction with the only variation between these two slider members being the fact that bottom slider member 44 is the mirror image of top slider member 42. Consequently, the same numerical references are employed in FIGS. 7 through 10 to refer to identical elements.

As shown in FIGS. 7 through 10, bottom slider member 44 and top slider member 42 each comprises a simple one piece construction having a base 90, a substantially L-shaped upstanding wall 91 formed along a portion of one side edge of base 90, and defining a terminal block locking zone 89, a substantially L-shaped edge 92 defining the other side edge of base 90, and a short upstanding wall 93 defining the forward termination of side edge 92.

In addition, base 90 incorporates a flexible arm 94, which extends from base 90 in juxtaposed spaced relationship thereto with a longitudinal axis substantially parallel to the major portion of L-shaped wall 91 and L-shaped side edge 92. As best seen in FIGS. 8 and 10, extension arm 94 incorporates a locking pin 95 positioned near the forward edge of arm 94, extending therefrom in one direction, with an L-shaped finger operable tab member 96 extending from arm 94 in the opposed direction.

Base 90 also comprises two elongated slots 97 and 98 which are formed therein, with slots 97 and 98 in substantially identical longitudinal alignment with each other. As is more fully described below, slots 97 and 98 cooperatingly engage with posts 87 of track guide member 41/43. In order to provide smooth, sliding interengagement of slider members 42 and 44 with track guide member 41/43, slots 97 and 98 comprise a width which is slightly greater than the diameter of post 87.

Furthermore, in order to define the three alternate positions in which slider members 42 and 44 may be moved relative to track guide member 41/43, elongated slot 97 incorporates two rounded bosses 99 and 99' in spaced relationship to each other, which extend partially into slot 97 on one side thereof. This construction creates three distinct, interconnected zones, which are separated by two areas adjacent bosses 99 and 99' wherein the width of slot 97 is reduced. As is more fully described below, bosses 99 and 99' with their adjacent smaller slot width prevent posts 87 from freely sliding the entire length of slot 97 and causes an operator to manually exert additional force to move bosses 99 and 99' past post 87. In this way, the three alternate positions of slider members 42 and 44 are controllably defined, while assuring ease of operator initiated movability and slidability of slider members 42 and 44 between these three alternate positions.

Figure 11:
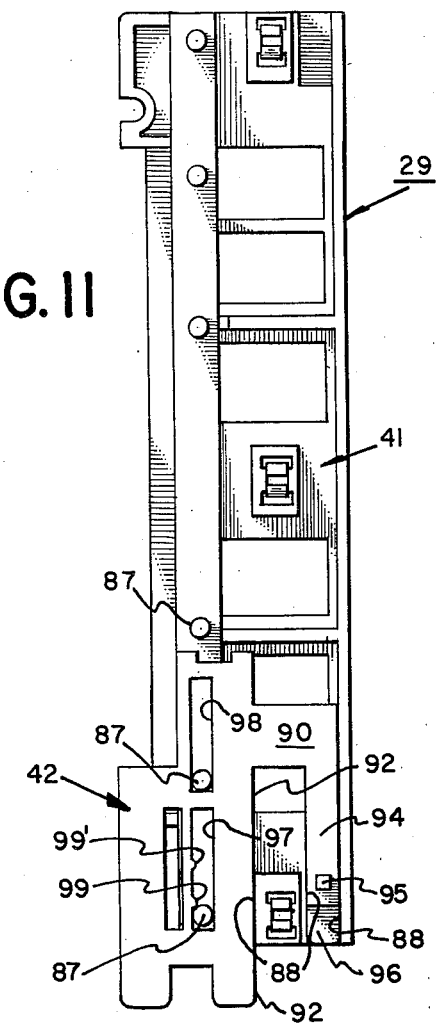
FIG. 11 is a top plan view of the upper slider assembly shown in its first, terminal block locked position.
Figure 12:
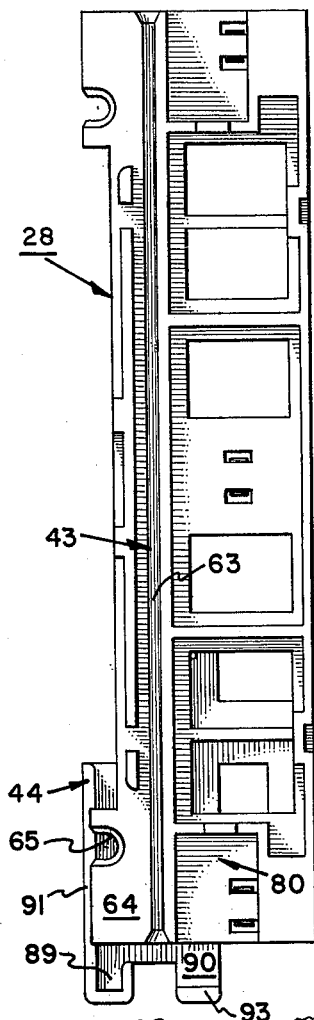
FIG. 12 is a top plan view of the lower slider assembly shown in its first, terminal block locked position.
Figure 21:
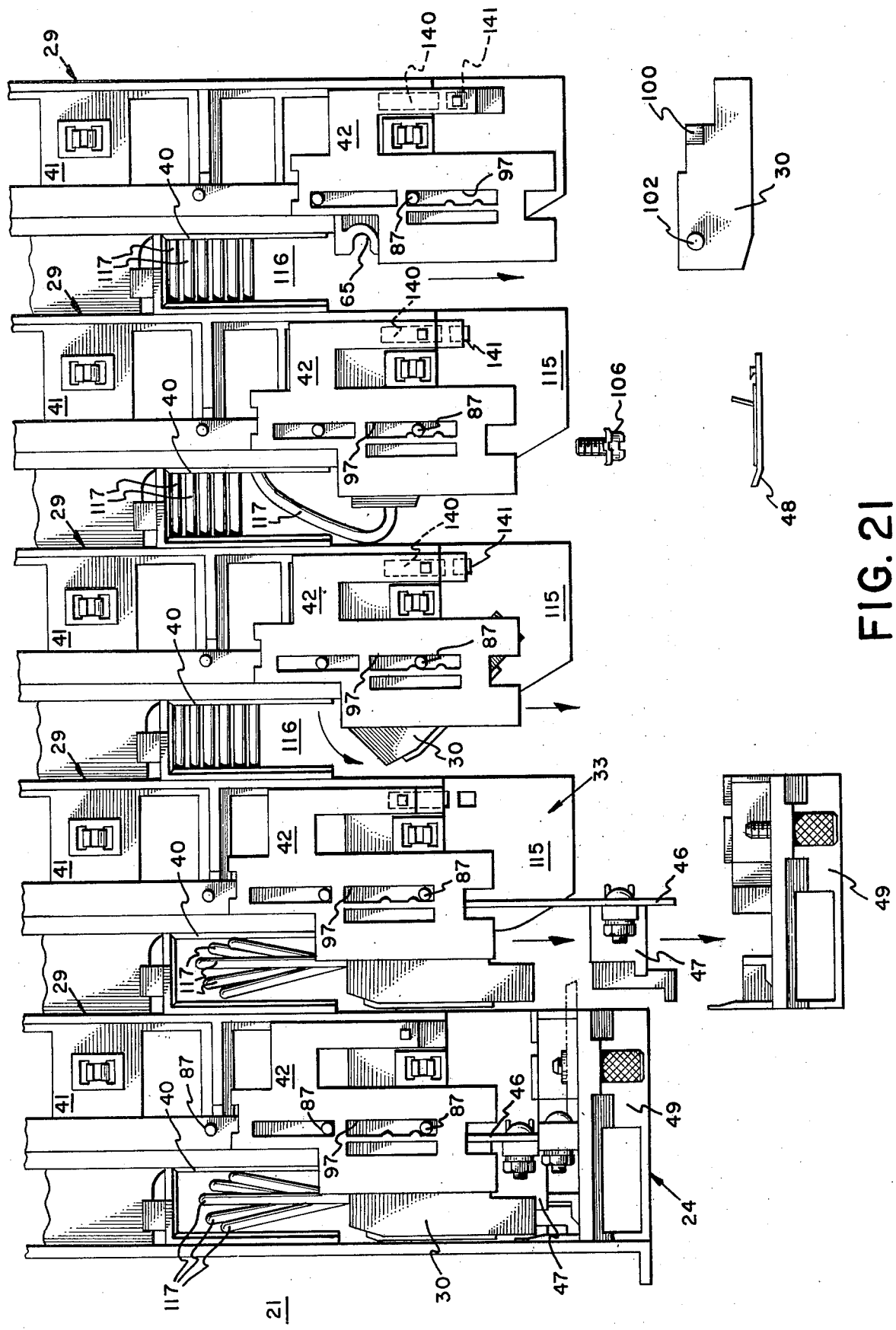
FIG. 21 is a top plan view, partially broken away, showing input/output modules of the input/output system of this invention in various stages of assembly and in alternate positions.

In FIGS. 11 and 12, slider assemblies 28 and 29 are shown fully assembled with the slider members 42 and 44 positioned in the terminal block locked position. By referring to FIGS. 11 through 16, the cooperative sliding interengagement of slider members 42 and 44 with track guide members 41 and 43 can best be understood. For convenience of understanding and for maximum comprehensibility and teaching of this invention, top plan views are depicted for top slider assembly 29 and bottom plan views for bottom slider assembly 28. In this way, all of the elements of slider assemblies 28 and 29 are shown and the movement of terminal block 30 can be easily understood by mentally placing terminal block 30 in its assembled position between top slider assembly 29 and bottom slider assembly 28, as shown in FIG. 21.

As shown in FIGS. 11 and 12, when slider assemblies 28 and 29 are in the terminal block locked position, slider members 42 and 44 are in inserted engagement with track guide members 41 and 43 to their maximum extent. As best seen in FIG. 11, this inserted engagement of slider member 42 with track guide member 41 is controlled and limited by the interengagement between posts 87 of track guide member 41 and elongated slots 97 and 98. As clearly shown in FIG. 11, posts 87 are positioned at one end of each elongated slot 97 and 98. In this way, the abutment of posts 87 of track guide member 41 with a terminating end of elongated slots 97 and 98 assures the operator with the positive stop when the terminal block locked position has been reached.

As best seen in FIG. 12, when slider member 44 is engaged with track guide member 43 in its terminal block locked position, wall 91 of slider member 44 provides a wall closure to U-shaped aperture 65, in which the pivot pin of the terminal block 30 is positioned. In this way, upstanding wall 91 in cooperation with aperture 65 of track guide member 43 assures that the pivot pin of terminal block 30 will be securely retained within U-shaped aperture 65.

Furthermore, locking tab 100 of terminal block 30, shown in phantom, is securely retained in holding zone 89 of slider member 44. As a result, when slider members 42 and 44 are in the terminal block locked position, as represented in FIGS. 11 and 12, terminal block 30 is securely captured between zones 89 and U-shaped aperture 65, and is unable to be arcuately moved in any direction.

Figure 13:
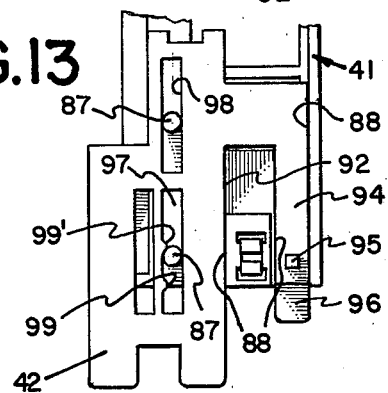
FIGS. 13 and 15 are top plan views, partially broken away, of the upper slider assembly of FIG. 11 shown in its two other positions.
Figure 14:
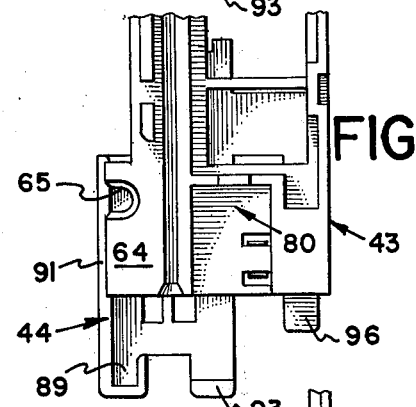
FIGS. 14 and 16 are top plan views, partially broken away, of the lower slider assembly of FIG. 12 showing its other two other positions.

When slider assemblies 28 and 29 are to be moved from their terminal block locked positions to their terminal block pivot positions, as represented by FIGS. 13 and 14, the operator simply grasps slider members 42 and 44 by upstanding walls 93, and simply pulls the slider members forwardly until any further forward movement is resisted. The initial forward movement of the slider members 42 and 44 will be resisted as the rounded boss 99 with its adjacent reduced slot width moves past post 87.

As shown in FIGS. 13 and 14, once slider members 42 and 44 have been moved forward a sufficient distance to cause rounded boss 99 of both slider members 42 and 44 to pass their adjacent posts 87, any further forward movement is now resisted by the rounded boss 99' contacting the posts 87. When slider members 42 and 44 are in this position, the slider assemblies 28 and 29 are in their terminal block pivot position.

As best seen in FIG. 14, when slider member 44 has been moved forwardly into its terminal block pivot position, holding zone 89 of slider member 44 is out of locking engagement with tab 100 of terminal block 30. However, upstanding wall 91 remains in juxtaposed facing relationship with U-shaped aperture 65 of track guide member 43. In this way, U-shaped aperture 65 is maintained closed to prevent the possible dislodgement of the terminal block pivot pin.

With holding zone 89 disengaged from locking tab 100, terminal block 30 is free to pivot about its pivot axis, established by the facing U-shaped apertures 65 of track guide members 41 and 43, and can move substantially 90° into zone 80. As is more fully described below, this 90° pivoted position allows the contact points of terminal block 30 to be forward facing, thereby providing the operator with ease of connecting external equipment wiring to terminal block 30.

Figure 15:
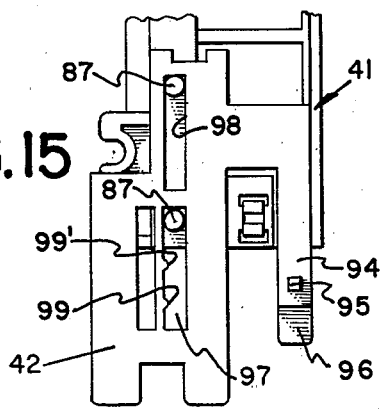
Figure 16:
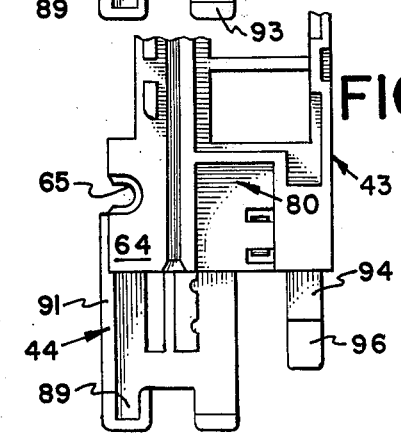

The third position in which slider assemblies 28 and 29 can be moved is represented by FIGS. 15 and 16. This position is described as the terminal block disengaged position. As best seen in FIG. 15, this third position is reached when slider member 42 has been manually moved forwardly, with the same force described previously, to cause rounded boss 99' and its adjacent reduced slot width to pass by post 87. Further movement beyond this third position is not possible, since the terminating end of slots 97 and 98 contact posts 87, establishing the furthermost forward extension of slider 42.

As shown in both FIGS. 15 and 16, when slider members 42 and 44 are moved into the terminal block disengaged position, upstanding wall 91 of slider members 42 and 44 is out of juxtaposed closing relationship with U-shaped aperture 65. Consequently, U-shaped aperture 65 is now open, with the pivot pins of terminal block 30 being easily removable from track guide members 41 and 43 and from slider assemblies 28 and 29.

Since this third terminal block disengaged position is a position which is not often required in the normal operations and installation of the present system, locking pin 95 of arm 94 is employed to assure that the operator does not accidentially move slider members 42 and 44 into this third position. As best seen in FIG. 21, locking pins 95 of movable arm 94 cooperate with apertures 140 and 141 formed in both top plate 34 and bottom plate 33 which allow slider members 42 and 44 to move between the terminal block locked position and the terminal block pivot position, but prevent slider members 42 and 44 from being moved from the terminal block pivot position into the terminal block disengaged position without manually disengaging locking pin 95 from apertures 140 in top plate 34 and bottom plate 33 by applying a disengagement force to tab 96 of flexible arm 94. In this way, accidental movement into the block disengaged position is assured and maximum operator control of slider assemblies 28 and 29 is provided. Similarly, the operator must manually disengage tab 96 of arm 94 from aperture 141 before slider members 42 and 44 can be moved from the terminal block disengaged position.

By referring to FIGS. 11 through 16, the operator controlled sliding ease of slider members 42 and 44 in track guide members 41 and 43 becomes readily apparent. As shown therein, guide tracks or walls 88 of track guide members 41 and 43 cooperate with edges 92 of base 90 and the side edges of arm 94 to assure that slider members 42 and 44 will move between its three alternate positions continuously and repeatedly when desired by the operator. In this way, the attainment of the desired goals of the present system are assured.

Terminal Block

Figure 17:
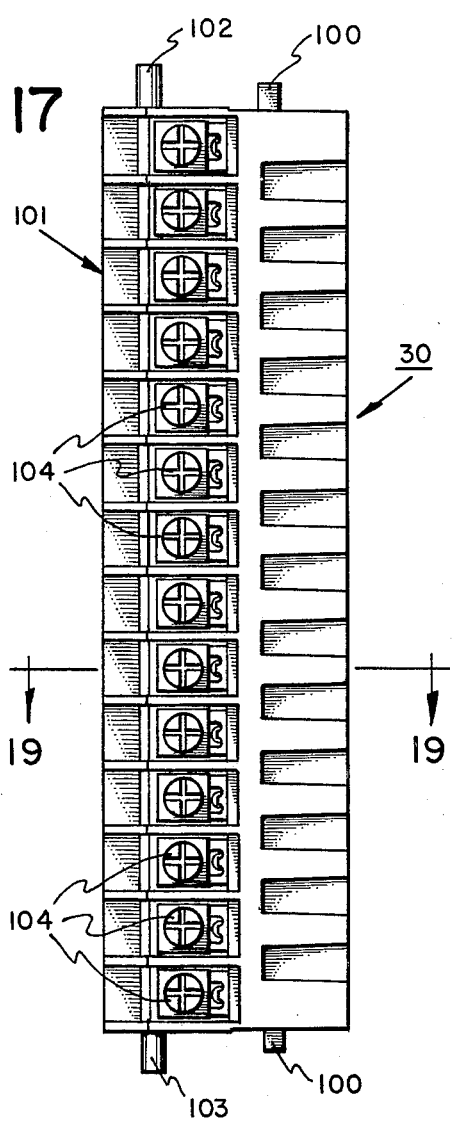
FIG. 17 is a side elevation view of the terminal block of the input/output system of this invention.
Figure 18:
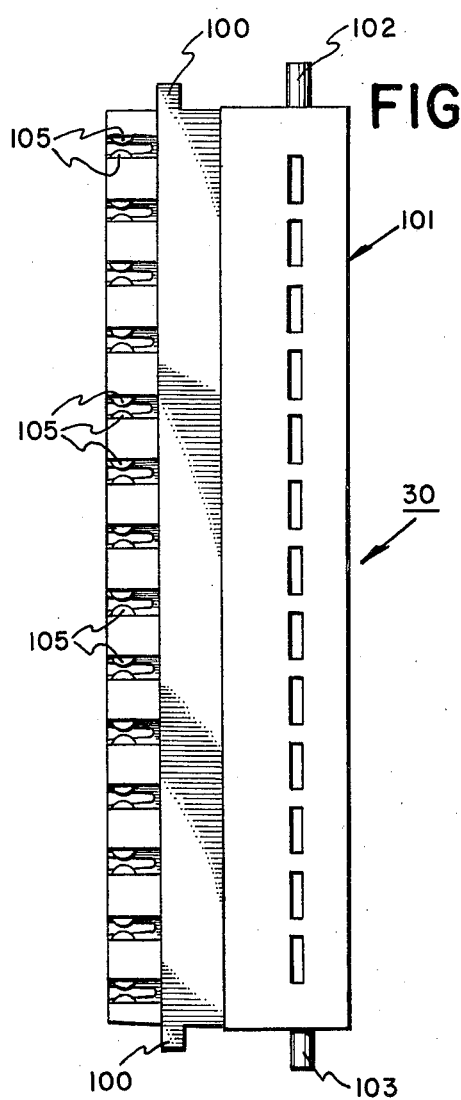
FIG. 18 is a side elevation view showing the opposed side of the terminal block of FIG. 17.

By referring to FIGS. 17, 18, 19, and 20, the construction and interconnection of external equipment with terminal block 30 of the present invention can best be understood. As shown in FIGS. 17 and 18, terminal block 30 preferably comprises a substantially rectangular housing 101 incorporating a pivot pin 102 mounted along the top edge thereof and a second pivot pin 103 mounted along the bottom surface thereof, with both pins 102 and 103 being positioned along a common central axis. As discussed above, pivot pin 102 is engaged in U-shaped aperture 65 of top slider assembly 29 while pivot pin 103 is positioned in U-shaped aperture 65 formed in slider assembly 28.

In addition, terminal block 30 incorporates two locking tabs 100 positioned on the top and bottom surface of terminal block 30, adjacent pivot pins 102 and 103. As fully discussed previously, locking tabs 100 cooperatingly engage with slider assemblies 28 and 29 to securely hold terminal block 30 in its fixed operational position.

When terminal block 30 is mounted between the upper and lower slider assemblies 28 and 29 and the slider assemblies are in their second position, terminal block 30 is freely pivotable, preferably through about a 90 degree arc of rotation. As is exemplified below, this pivoting motion is employed to provide ease of installation and rapid assembly of the entire input/output system of this invention.

Figure 20:
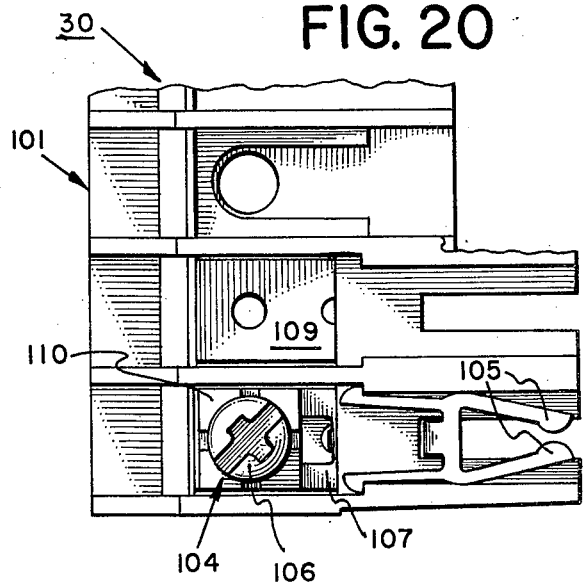
FIG. 20 is a greatly enlarged side elevation view of a portion of the terminal block, partially broken away.

In this embodiment, terminal block 30 comprises fourteen independent wire connection points 104 for securely mounting the lead wires from the external equipment of the user to the input/output system. As best seen in FIG. 20, each connection point 104 is independently conductively connected to a forward facing contact pin 105 positioned along the front surface of housing 101 of terminal block 30. As shown in FIG. 20, in the preferred embodiment, front contact pins 105 comprise a tuning fork shape in order to assure a quick and easy positive interconnection with a contact plate contained on the front cover-connector, while also assuring quick and easy disconnection and self wiping.

In this embodiment, terminal block 30 comprises fourteen user equipment wire connection points, as well as the corresponding fourteen forward facing contact pins 105. Fourteen connection points are employed in order to provide a system which is capable of satisfying Japanese, European, and American wiring standards.

Figure 19:
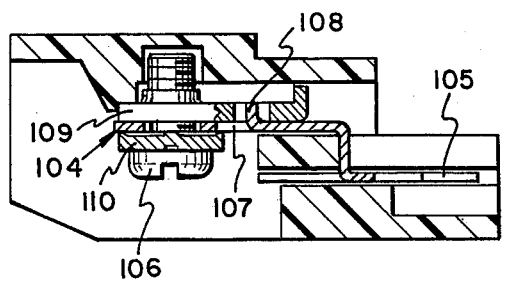
FIG. 19 is a cross sectional top plan view of the terminal block of FIG. 17, taken along line 19—19 of FIG. 17.

As shown in FIGS. 19 and 20, tuning fork contact pin 105 comprises a substantially flat metal stamping which extends rearwardly, and terminates in a substantially flat plate 107 which forms a part of the user wire connection point 104. In addition, substantially flat plate 107 incorporates substantially perpendicular extending tabs 108 which cooperates with the user connection point 104.

In addition to substantially flat plate 107 and tabs 108, each user wire connection point 104 also incorporates a tapped steel plate 109, a threaded screw 106 and a pressure plate 110. Each connection point 104 is designed to accept either bare wire or ring lugs, whichever is preferred.

In order to install the user equipment, screw 106 need be disengaged, with the bare wire or ring lug of the user equipment wire being mounted between substantially flat plate 107 and pressure plate 110. The contact is then completed by merely threadedly advancing screw 106 within the tapped hole of plate 109 until secure firm contact has been made. The construction of pin 105 with substantially flat plate 107 and tabs 108 cooperate with plate 109 to provide sufficient strength to allow torquing the screw down until secure firm contact has been made.

From this construction, it is readily apparent that electronic engagement of the user's equipment in connection points 104 assures that pins 105 are also in active electronic engagement with the particular equipment wired to its cooperating connection point 104. As will be more fully described below, the plurality of tuning fork contact pins 105 enables the front cover-connector, with cooperating, pin-mating contact plates, to be inserted into terminal block 30 and simultaneously interconnect all of the external equipment connected to terminal block 30 with the input/output printed circuit board in a quick and easy one-step operation.

In the preferred embodiment, housing 101 comprises plastic material. In addition, housing 101 is designed to allow the plastic mold to be a single draw, thereby assuring ease of construction and assembly. Also, each user equipment connection point 104 is preferably constructed to accept a minimum of at least two number 14 AGW wires and a maximum of at least one number 22 AGW wire. Of course, any alternative material could be employed without departing from the scope of this invention.

Wiring Installation and Electrical Interconnection Of Input/Output System

In FIG. 21, input/output assembly 21 is shown with (a) one input/output module 24 installed in place ready for operation, (b) a second input/output module 24 shown with its front connector 47, printed circuit board 46, and front cover 49 being removed, (c) a third input/output module 24 shown with the slider assemblies 28 and 29 positioned in their second position with terminal block 30 partially pivoted, (d) a fourth input/output module 24 shown with the slider assemblies in their second position and terminal block 30 fully pivoted ready for wiring of the user equipment thereto, and (e) a fifth input/output module 24 shown with its slider assemblies in their third position, fully extended forwardly with terminal block 30 shown removed.

Input/output assembly 21 comprises a lower support plate 33 which incorporates forwardly extending platforms 115 to which track guide members 43 of lower slider assemblies 28 are securely mounted. Since platforms 115 each comprise independent finger-like extensions, a plurality of open cavities 116 are formed therebetween. Open cavities 116 establish the required void area in which the user equipment wiring is maintained after having been securely mounted to terminal block 30. In order to assure that the wiring is maintained in its desired location, U-shaped wire ducts 40 are mounted in cavities 116, lockingly engaged with adjacent slider assemblies 28 and 29.

As previously discussed in reference to FIG. 3, a wire support plate 39 is located below lower support plate 33. By mounting the open ended wire support plate 39 in juxtaposed spaced relationship to lower support plate 33, the void zone established therebetween provides a substantially enclosed wiring duct wherein all of the user equipment wiring to be connected to terminal block 30 of input/output system 21 is conveniently supportingly maintained.

As shown in FIG. 21, the plurality of user wires 117 extend within this zone supportingly maintained on support plate 39. Although the wires may enter from either the open ended left side or the open ended right side of input/output assembly 21, it has been found that greater convenience is generally achieved by feeding the wires into input/output system 21 from the right side. The wires are brought to each input/output system 21 through conventional wiring containment channels which are well-known in the art.

In order to interconnect an external device to an input/output module 24 of input/output system 21, the various wires coming from the particular external equipment are merely fed through the wired duct formed between wire support plate 39 and lower support plate 33 until the particular terminal block 30, to which the wire is to be connected, is reached. During the wiring operation, slider assemblies 28 and 29 are moved into their second position, and terminal block 30 is rotated into its forward facing position, as shown in FIG. 2. As discussed above, this forward facing position is employed for the purpose of wiring, since connection points 104 of terminal block 30 are then readily accessible to the user, providing optimum ease and convenience for the wiring installation.

In order to install the equipment wires to a terminal block 30, the particular wires from the user equipment are brought upwardly through cavity 116 of support plate 33, around the rear edge of terminal block 30 and securely mounted to the particular connection point 104 on terminal block 30 using screws 106. This process is repeated for each wire coming from the various external equipment to be controlled by the particular input/output module 24, until all equipment has been so connected to terminal block 30.

Once all of the external equipment to be controlled by a particular module has been wired to the various connection points 104 of terminal block 30, terminal block cover 48 is snapped in place over connection points 104. The use of cover 48 prevents any undesirable shorting or arcing between connection points. To return terminal block 30 to its operational position, terminal block 30 is simply rotated back 90° to its original position.

As described above, terminal block locking zones are incorporated on slider portions 42 and 44 in order to assure secure locked interengagement and holding of terminal block 30 in this normal, installed, operational position. When terminal block 30 is rotated into its original, operational position, slider portions 42 and 44 are simply pushed inwardly until their first, fully engaged, locked position is reached.

This construction has been found to be extremely advantageous, since all of the user wiring is maintained out of normal view. Therefore, the wires are not susceptible to undesirable and unwanted handling, as well as providing a more attractive system since the wires are not visible. Also, the wires are located in a position isolated from the active components of the printed circuit board.

Input/output system 21 is completed and ready for operation by inserting printed circuit board 46 into the input/output assembly and mounting circuit board connector 47 and front cover 49 in place to provide the electronic interconnection of the input/output printed circuit board 46 with the external equipment wired to terminal block 30. In FIGS. 19 and 20, one input/output module 24 is shown in its fully assembled position ready for operation.

As shown therein, terminal block 30 is in its installed position with wires 117 connected thereto. Slider members 42 and 44 of slider asemblies 28 and 29 are in their first, terminal block locked positions, and printed circuit board 46 is in its inserted, supportingly contained position between slider assemblies 28 and 29. In addition, front cover 49 and connector 47 are mounted to input/output system 21, providing the required electronic interconnection between terminal block 30 and printed circuit board 46.

In FIG. 22, a completely assembled input/output system 21 is shown with an input/output module 24 assembled ready for operation. As shown in FIG. 22, printed circuit board 46, when fully supportingly maintained between lower slider assembly 28 and upper slider assembly 29 is interconnected with the central processor through rear connector 45 which electronically engages and interconnects edge contacts 126 formed along a rear extension surface of printed circuit board 46. Rear connector 45 is electronically engaged to back plane mother board 36 in the conventional manner and interconnected with adjacent input/output systems via cable 37. In addition, back plane mother board 36 incorporates switches, well-known in the art, to provide desired address selection for processing information from input/output assemblies 21, as well as directing and processing information between the various input/output modules 24 of an individual input/output system 21.

Front Cover and Connector

In FIGS. 23 and 24, the printed circuit board front connector 47 is shown inserted into electrical interengagement with forked contact pins 105 of terminal block 30. In FIGS. 25 and 26 the engagement of front cover 49 with connector 47 is shown, with FIG. 26 depicting details of the mounting of connector 47 and cover 49 to a printed circuit board 46.

Connector 47 incorporates a plurality of substantially flat contact plates 120, supportingly maintained in spaced non-conductive relation to each other, a portion of which is constructed and positioned for rapid installation and complete electrical engagement with pins 105 of terminal block 30. As shown in FIG. 23, a second portion of plate 120 incorporates pins 122 which are electrically connected to printed circuit board 46. In this way, electrical interconnection of connector 47 and printed circuit board 46 with all the external equipment connected to terminal block 30 is provided in a quick, simple, one step operation.

Whenever printed circuit board 46 must be removed, only its associated connector 47 need be withdrawn from mated contact within pins 105. Consequently, the equipment wiring remains intact and complete electrical disconnection is achieved rapidly, easily and efficiently.

In the preferred embodiment, printed circuit board 46 is mounted for engagement with connector 47 and front cover 49, in order to provide a readily available and accessible component which will enable printed circuit board 46 to be easily disconnected and removed from input/output system 21 without having to directly touch printed circuit board 46. As shown in FIGS. 20 and 26, printed circuit board 46 is securely mounted to connector 47 and cover 49 at the top and bottom corners thereof.

In addition, front cover 49 incorporates quick disconnect locking pins 130 which matingly engage with the top and bottom support plates of input/output system 21, as shown in FIG. 20. In this way, front cover 49, connector 47 and printed circuit board 46 can be inserted into input/output system 21, and quickly locked in position. However, if removal or replacement of front cover 49, connector 47, and printed circuit board 46 is required, locking pins 130 can be quickly disconnected, assuring quick and rapid accessibility to the input/output printed circuit board.

In FIG. 20, the interconnection system is shown for assuring that the fourteen contact points along the forward edge of printed circuit board 46 will be in continuous and trouble-free electronic engagement with the fourteen contacts of terminal block 30. As briefly discussed above, connector 47 incorporates contact plates having dual pins extending sideways for mating interconnection with dual pin receiving holes 131 formed in printed circuit board 46. Once each of the dual pins have been inserted into the cooperating holes 131 of printed circuit board 46, the pins are soldered in position in order to assure secure continuous electronic engagement with printed circuit board 46. Also, if desired, front edge contacts may be employed similar to edge contacts 126 used along the rear surface of printed circuit board 46. By employing edge contacts along the front edge of printed circuit board 46, connector 47 would be completely removably connectable from printed circuit board 46 when disconnected from input/output system 21.

Furthermore, as shown in FIG. 20, fastening means 134 securely mount connector 47 to printed circuit board 46. Similarly, cover 49 is secured to printed circuit board 46 by mounted fastening means 128 through holes 123 formed in printed circuit board 46. With printed circuit board 46 securely mounted to cover 49 and connector 47, the entire system is secure. Of course, any alternative interconnecting and securing means may be employed.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. An expandable, multi-purpose input/output system interconnected with a central processor to form a machine controller interconnected with and operating external devices, comprising
   A. a housing incorporating means for communicating with the central processor;
   B. a printed circuit board incorporating
      a. means for disengageably interconnecting said printed circuit board with the communicating means of the housing, and
      b. a plurality of electrically independent contacts for communicating with the external equipment;
   C. a pair of slider assemblies mounted to the housing in juxtaposed, spaced, cooperating, facing relationship, thereby forming an upper slider assembly and a lower sliding assembly, each of said slider assemblies comprising
      a. a track guide member fixedly mounted to the housing, and incorporating
         1. holding means for supportingly holding the printed circuit board,
         2. movement limiting means for controlled sliding engagement of a slider member, and
         3. retaining means for supportingly retaining a terminal block, and
      b. a movable slider member
         1. incorporating engagement means captively interconnected with said movement limiting means of the track guide,
         2. movable relative to the track guide member between three alternate, terminal block controlling positions, and
         3. incorporating retaining means cooperatively associated with the retaining means of the track guide member to movably retain a terminal connector block on the fixed track guide members,
   D. a terminal connector block controllably mounted to the two fixed track guide members and comprising
      a. a plurality of wire connection points for electrically connecting the external equipment to the input/output system, and
      b. a plurality of quick disconnect contacts, with each of said contacts being independently conductively associated with one wire connection point; and
   E. a connector panel incorporating a plurality of conductively independent contacts for electrically interconnecting the quick disconnect contacts of the terminal connector block with the plurality of electrically independent contacts of the printed circuit board;

whereby an input/output system is achieved wherein the external equipment wires are easily connected to the terminal connector block, the movement of which is fully controlled by the slider assembly, wherein the printed circuit board is quickly and easily disengageably inserted and interconnected with the central processor, and wherein complete electrical interconnection of the external equipment through the printed circuit board to the central processor is made quickly and easily without requiring disassembly of the external equipment wires for removal, replacement or repair of the printed circuit board.

2. The input/output system defined in claim 1, wherein the track guide member is further defined as comprising guide means to assure ease of sliding movability of the slider member between its three alternate terminal block controlling positions.

3. The input/output system defined in claim 2, wherein the guide means of the track guide member comprises wall portions formed thereon positioned in juxtaposed sliding contact with side edges of the slider member, thereby assuring controlled movement of the slider member through its three alternate positions.

4. The input/output system defined in claim 1, wherein the movement limiting means of the track guide member are defined as comprising at least one post member extending from the surface of the track guide member which is in juxtaposed spaced facing relationship with the housing, and the engagement means of the slider member comprises an elongated slot having
- (i) a width slightly greater than the diameter of the post member, and
- (ii) positioned peripherally surrounding and containing the post member, thereby defining and controlling the maximum travel distance of the slider member relative to the track guide member.

5. The input/output system defined in claim 4, wherein the elongated slot of the slider member is further defined as comprising two bosses formed on one of the elongated sides of the slot, in juxtaposed spaced relationship to each other, and extending towards the opposed elongated side of the slot, creating two reduced width zones along the slot, whereby additional effort is required to move the post member of the track guide member past the extension bosses establishing three, distinct, alternate positions.

6. The input/output system defined in claim 1, wherein the track guide member is further defined as being symmetrical about its central transverse axis, thereby providing a single track guide member which can be employed in both the upper slider assembly and the lower slider assembly.

7. The input/output system defined in claim 1, wherein the retaining means of the track guide comprises an open, substantially U-shaped aperture formed along one side of the track guide, and the cooperating retaining means of the slider member comprises an upstanding wall portion positioned along one side of the track guide in blocking relationship with the entry portal of the U-shaped aperture, thereby effectively closing the open aperture of the track guide.

8. The input/output system defined in claim 7, wherein the wall portion of the slider comprises an overall length to assure maintenance of the wall portion in blocking relationship with the aperture of the track guide in two of its three alternate positions, and in non-blocking relationship with the U-shaped aperture of the track guide when the slider is moved into its third position.

9. The input/output system defined in claim 8, wherein the terminal connector block is further defined as comprising two pivot pins positioned at opposed ends thereof for mounted engagement with the U-shaped aperture of the track guide, thereby providing retention of the terminal connector block in its mounted position in two of the three slider positions, while also providing disengageability of the terminal connector block from the slider assemblies when the slider members of each slider assembly have been moved into their third position.

10. The input/output system defined in claim 9, wherein the terminal connector block is further defined as comprising at least one locking tab and the slider member is defined as comprising a locking tab holding zone positioned for locking engagement of the locking tab of the terminal connector block within said locking tab holding zone when the slider member is in its first position, thereby assuring secure locked retention of the terminal connector when the slider member is in its first position, while also providing disengagement of the locking tab of the terminal connector block when the slider member has moved into its second position.

11. The input/output system defined in claim 10, wherein the track guide member is further defined as comprising stop means for limiting the arcuate pivoting movement of the terminal block to assure movement of the terminal connector block into its optimum position for connection of the external equipment wiring thereto.

12. The input/output system defined in claim 1, wherein the housing comprises an upper support plate to which the upper slider assembly is securely mounted and a lower support plate to which lower slider assembly is securely mounted, and both the upper support plate and the lower support plate are further defined as incorporating a first aperture in the form of an elongated slot, the length of which is equal to the distance travelled by the slider member in moving between its first and second position, and each slider member of each slider assembly is further defined as comprising a flexible arm portion extending therefrom with said arm portion incorporating a locking pin positioned for sliding engagement within the elongated slot of the support plate, whereby the slider member is able to freely move between its first and second positions while requiring disengagement of the pin from the elongated slot before being able to move from its second position into its third position.

13. The input/output system defined in claim 12, wherein the support plates are further defined as comprising a second aperture spaced away from the first aperture and lying along the same longitudinal axis thereof, and positioned for locking engagement with the locking pin of the flexible arm when the slider is moved into its third position, thereby requiring disengagement of the pin from the second aperture when movement of the slider member from the third position to the second position is required.

14. The input/output system defined in claim 1, further comprising a substantially U-shaped wire holding duct mountable between two adjacent upper slider assemblies and extending therefrom to interengagement between two adjacent lower slider assemblies, thereby providing an open channel through which external equipment wiring is retainingly held for extension to the terminal connector block.

15. In an expandable, multi-purpose input/output system interconnected with a central processor to form a machine controller interconnected with and operating external devices, comprising
- A. a housing incorporating means for communicating with the central processor;
- B. a printed circuit board incorporating
  - a. means for disengageably interconnecting said printed circuit board with the communicating means of the housing, and
  - b. a plurality of electrically independent contacts for communicating with the external equipment;
- C. a pair of slider assemblies mounted to the housing in juxtaposed, spaced, cooperating facing relationship, with one slider assembly forming the upper slider assembly and the other slider assembly forming the lower slider assembly,
- D. a terminal connector block controllably mounted to the two fixed track guide members and comprising a. a plurality of wire connection points for electrically connecting the external equipment to the input/output system, and
b. a plurality of quick disconnect contacts, with each of said contacts being independently conductively associated with one wire connection point; and E. a connector panel incorporating a plurality of conductively independent contacts for electrically interconnecting the quick disconnect contacts of the terminal connector block with the plurality of electrically independent contacts of the printed circuit board, the improvement comprising slider assemblies wherein each slider assembly comprises
a. a track guide member mounted to the housing and incorporating
   1. holding means for supportingly holding the printed circuit board,
   2. movement limiting means for controlled sliding engagement of a slider member, and
   3. retaining means for supportingly retaining the terminal connector block; and
b. a movable slider member
   1. movably mounted to the track guide member in captive interengagement with the movement limiting means,
   2. movable relative to the track guide between three alternate terminal block controlling positions, and
   3. incorporating means cooperatively associated with the retaining means of the track guide member to movably retain a terminal connector block on the fixed track guide members;

whereby an input/output system is achieved wherein the external equipment wires are easily connected to the terminal connector block, and the movement of the terminal connector block is fully controlled by the slider assembly, wherein the printed circuit board is quickly and easily disengageably inserted and interconnected with the central processor, and wherein complete electrical interconnection of the external equipment through the printed circuit board to the central processor is made quickly and easily without requiring disassembly of the external equipment wires for removal, replacement or repair of the printed circuit board.

* * * * *